US007821020B2

(12) United States Patent
Park

(10) Patent No.: US 7,821,020 B2
(45) Date of Patent: Oct. 26, 2010

(54) PACKAGE FOR LIGHT EMITTING DEVICE WITH METAL BASE TO CONDUCT HEAT

(75) Inventor: Jun Seok Park, Gwangoo-shi (KR)

(73) Assignee: LG Innotek Co., Ltd., Seoul (KR)

( * ) Notice: Subject to any disclaimer, the term of this patent is extended or adjusted under 35 U.S.C. 154(b) by 526 days.

(21) Appl. No.: 10/578,150

(22) PCT Filed: Jul. 21, 2005

(86) PCT No.: PCT/KR2005/002368

§ 371 (c)(1), (2), (4) Date: May 3, 2006

(87) PCT Pub. No.: WO2006/065015

PCT Pub. Date: Jun. 22, 2006

(65) Prior Publication Data

US 2008/0290352 A1 Nov. 27, 2008

(30) Foreign Application Priority Data

Dec. 17, 2004 (KR) ...................... 10-2004-0107782

(51) Int. Cl.
*H01L 29/227* (2006.01)

(52) U.S. Cl. ........................... 257/98; 257/99; 257/100; 257/499; 257/918

(58) Field of Classification Search .................. 257/98, 257/99, 100, 103, 499, 918
See application file for complete search history.

(56) References Cited

U.S. PATENT DOCUMENTS 4,767,674 A 8/1988 Shirai et al.
5,994,212 A * 11/1999 Arakawa et al. ............ 438/617
6,809,261 B1 10/2004 Ng et al.
6,936,855 B1 * 8/2005 Harrah ........................ 257/88
2004/0065894 A1 4/2004 Hashimoto et al.
2004/0095738 A1 5/2004 Juang
2004/0099874 A1 5/2004 Chang et al.
2004/0222433 A1 11/2004 Mazzochette et al.

FOREIGN PATENT DOCUMENTS

| | | | |
|---|---|---|---|
| EP | 0525644 | A1 | 2/1993 |
| EP | 1467414 | A1 | 10/2004 |
| JP | 8-008463 | A | 1/1996 |
| JP | 10-012927 | A | 1/1998 |
| JP | 2003-008073 | A | 1/2003 |
| JP | 2004-39691 | A | 2/2004 |
| JP | 2004-311791 | A | 11/2004 |

* cited by examiner

*Primary Examiner*—Thanh V Pham
(74) *Attorney, Agent, or Firm*—Birch, Stewart, Kolasch & Birch, LLP

(57) ABSTRACT

A light emitting device includes a metal base, an electrical circuit layer provided at an upper side of the metal base for providing a conductive path, a light emitting device mounted in a second region having a smaller thickness than a first region on the metal base, an insulating layer sandwiched between the metal base and the electrical circuit layer, an electrode layer provided at an upper side of the electrical circuit layer, and a wire for electrically connecting the electrode layer and the light emitting device. The light emitting device package has improved light emission efficiency since the light emitting device is placed on a small thickness portion of the metal base.

22 Claims, 6 Drawing Sheets

310
390
380
392
322
320
330
340
350
A
360

PACKAGE FOR LIGHT EMITTING DEVICE WITH METAL BASE TO CONDUCT HEAT

TECHNICAL FIELD

The present invention relates to a light emitting device package, and more particularly, to a light emitting device package, which is excellent in heat radiation performance and allows circuit design for control of light emission of a semiconductor light emitting device to be freely done.

BACKGROUND ART

Generally, as a semiconductor light emitting device, a LED (Light Emitting Diode) can be included, which is a device used for converting electrical signals in the form of infrared, visible and ultraviolet light to emit light by using the characteristics of compound semiconductor.

As for the range of use of LEDs, LEDs are usually used for home appliances, remote controllers, electric signs, displays, a variety of automation equipment, etc, and roughly divided into IRED (Infrared Emitting Diode) and VLED (Visible Light Emitting Diode). The structure of the above-said LED is as follows in general.

Generally, in a blue LED, a N type GaN layer is formed on a sapphire substrate, N-metal is formed on one side of the surface of the N type GaN layer, and an active layer is formed on the portions except for the region where the N-metal is formed. And, a P type GaN layer is formed on the active layer, and P-metal is formed on the P type GaN layer. The active layer is a layer that generates light by holes flowing through the P-metal and electrons flowing through the N-metal being combined to each other.

The aforementioned LED is used for home appliances, electric signs and the like according to the intensity of light output. Especially, LEDs have a tendency to become slimmer as information communication equipment are getting smaller in size, and peripheral equipment, such as resistors, condensers, noise filters, etc., are getting much smaller.

Consequently, light emitting devices are packaged in a surface mount device (hereinafter, "SMD") type so that the light emitting device can be directly mounted to a PCB (Printed Circuit Board). Accordingly, LED lamps used as a display device are also being developed in a SMD type.

Such a SMD can substitute an existing simple lighting lamp, and used for lighting displays, character displays, image displays, etc. that produces variety of colors.

As above, as the range of use of LEDs has been becoming wider, a required luminescence is becoming higher and higher, like in lamps used for daily life, rescue signaling lamps and the like. Thus, high output LEDs have been widely used in recent years.

FIG. 1 is an explosive perspective view of a structure of a light emitting device package according to the prior art.

As shown therein, in the structure of the light emitting device package 100 according to the prior art, electrode lead frames 130 for applying power to a light emitting device from an external PCB are respectively formed and arranged on a package body 120.

A lens 110 is attached on top of the package body 120 in order to improve the light efficiency of light generated from a LED 140 used as the light emitting device.

An assembly having the LED 140 mounted therein is combined to the bottom of the package body 120. Firstly, a reflecting cup 160 with a high light reflectivity is combined onto an electrical conductor 170. The LED 140 is mounted on a sub mount 150 formed of silicon by flip chip bonding or wire bonding. Though not shown, a reflecting hole is formed inside the sub mount by etching the sub mount 150, a reflective layer is formed on the reflecting hole, and then the LED 140 is mounted.

When the LED 140 is mounted on the sub mount 150, the sub mount 150 is mounted on the reflecting cup 160 formed on the conductor 170, and then an electrical connection process with the electrode lead frames 130 of the LED body 120 is carried out so as to apply power.

The light emitting device package 100 thus assembled reflects the light generated from the LED 140 against the reflecting cup 160, and then diffuses the light to outside via the lens 110.

FIG. 2 is a view showing light emitting device packages 100*a*, 100*b* and 100*c* according to the prior art provided in plural number on a circuit substrate 200.

According to FIG. 2, unlike the light emitting device package presented in FIG. 1, a plurality of LEDs 100*a*, 100*b* and 100*c* are used integrally, in which they are provided in three colors of red, green and blue, respectively and lead frames 130*a*, 130*b* and 130*c* are respectively bonded onto the circuit substrate 200 by a solder 180.

However, the light emitting device package 100 having the aforementioned structure has a problem that if the intensity of current is increased in order to obtain light having a high output, a high temperature heat is generated due to poor heat radiation performance in the package. In a case where the high temperature heat exists in the package without being radiated, the resistance becomes very high and thus the light efficiency becomes deteriorated.

Further, the prior art light emitting device package 100 has a drawback that because the conductor 170, reflecting cup 160, package body 120 and the like are separated from each other, the heat generated from the LED is not easily transferred to outside due to a high heat resistance of their contact portions.

Further, there is an inconvenience that since only one LED is mounted in the package body 120, three light emitting device packages must be placed in a set in order to display high output white. In this case, there is another drawback that the control circuit becomes complex and the volume becomes larger.

Further, in the plurality of single unit type light emitting device packages 100*a*, 100*b* and 100*c* combined to each other, the surface area of the entire substrate 200 is increased so as to connect electrodes from outside, thus increasing the cost of the assembling process.

Further, the structure of the prior art light emitting device package 100 has a problem not only in terms of heat radiation but also in terms of structure. Specifically, there is a problem that colors cannot be mixed on an ideal point light source due to the characteristics of RGB color mixing since air bubbles may be formed upon molding and the single unit type light emitting device packages are arranged on a wide surface area. Besides, there is a problem that the thickness of the lens to be mounted becomes larger due to the arrangement of an electrode, insulating layer, molding space and LED.

DISCLOSURE

Technical Problem

The present invention is directed to solve the aforementioned problems, and it is an object of the present invention to provide a light emitting device package, which is improved in heat conductivity by eliminating the structure obstructing the heat radiation of a light emitting device from a multilayered mounting structure when directly mounting the light emitting device on a metal PCB.

Furthermore, it is another object of the present invention to provide a light emitting device package, in which each component of a light emitting device is built in respective modules and mounted and a plurality of light emitting device packages are efficiently arranged on a metal PCB, and which makes circuit configuration easier, when directly mounting the light emitting device on the metal PCB.

Furthermore, it is yet another object of the present invention to provide a light emitting device package, which improves a metal PCB structure and a molding structure so as to minimize the thickness of a lens in preparing a lens for the distribution of light and minimizes the rejection rate caused by air bubbles generated during a molding process.

Technical Solution

To achieve the above objects, there is provided a light emitting device package according to the present invention, comprising: a metal base; an electrical circuit layer provided at an upper side of the metal base for providing a conductive path; an insulating layer sandwiched between the meta base and the electrical circuit layer; a light emitting device mounted on the top surface of the metal base in an open space from which the insulating layer is removed; an electrode layer provided at an upper side of the electrical circuit layer; and a connection portion for electrically connecting the electrode layer and the light emitting device.

Additionally, there is provided a light emitting device package according to another aspect of the present invention, comprising: a metal base; an electrical circuit layer provided at an upper side of the metal base for providing a conductive path; a light emitting device mounted in a second region having a smaller thickness than a first region on the metal base; an insulating layer sandwiched between the metal base and the electrical circuit layer; an electrode layer provided at an upper side of the electric circuit layer; and a connection portion for electrically connecting the electrode layer and the light emitting device.

ADVANTAGEOUS EFFECTS

According to the present invention, because heat generated from inside the light emitting device package can be efficiently released, as many high output light emitting devices as possible can be arranged in various forms in a restricted space within the package. Thus, the light emitting device package can be utilized in various ways for light emitting device applications having a tendency to be decreased in size.

Additionally, according to the present invention, the manufacturing cost can be cut down, and the process can be minimized. Besides, excellent characteristics can be obtained uniformly in terms of heat radiation, optics with high light collectivity, mechanics, product reliability, etc.

DESCRIPTION OF DRAWINGS

The present invention will be more fully understood by reference to the accompanying drawings, in which.

BEST MODE

Hereinafter, a light emitting device package according to preferred embodiments of the present invention will be described in detail with reference to the accompanying drawings.

First Embodiment

Figure 1:
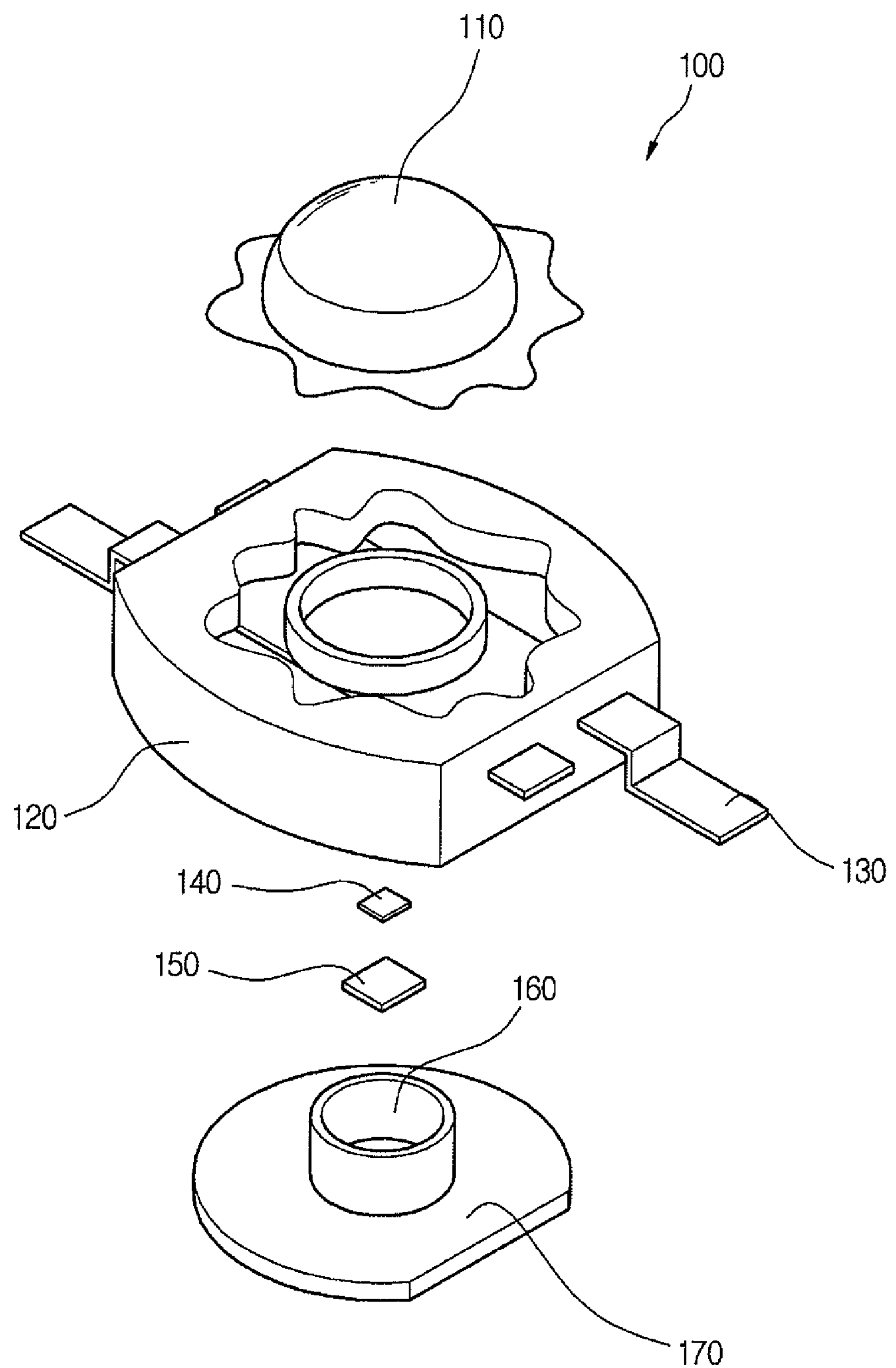
FIG. 1 is an explosive perspective view of a structure of a light emitting device package according to the prior art.
Figure 2:
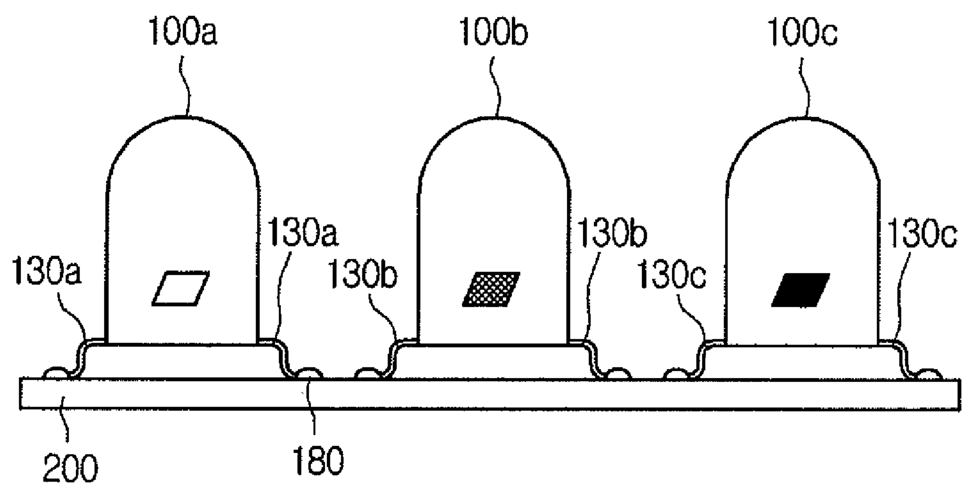
FIG. 2 is a view showing light emitting device packages according to the prior art provided in plural number on a circuit substrate.
Figure 2:
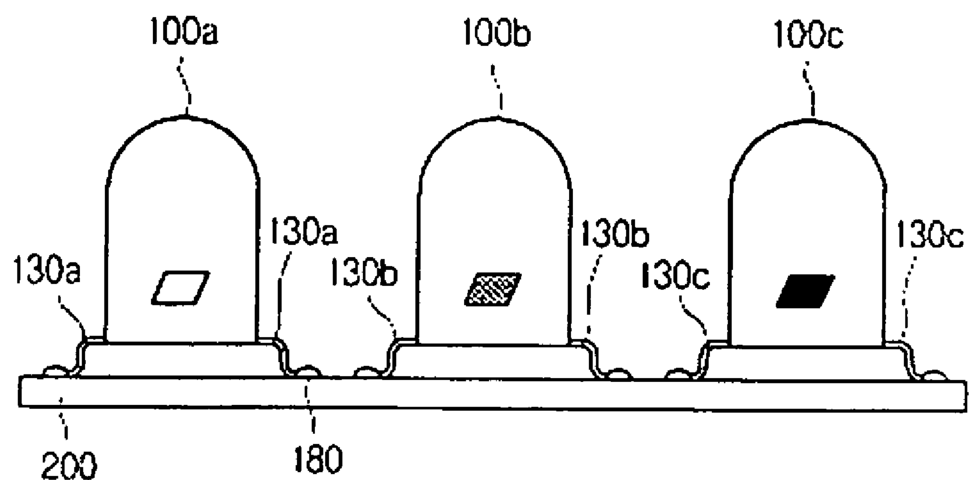
Figure 3:
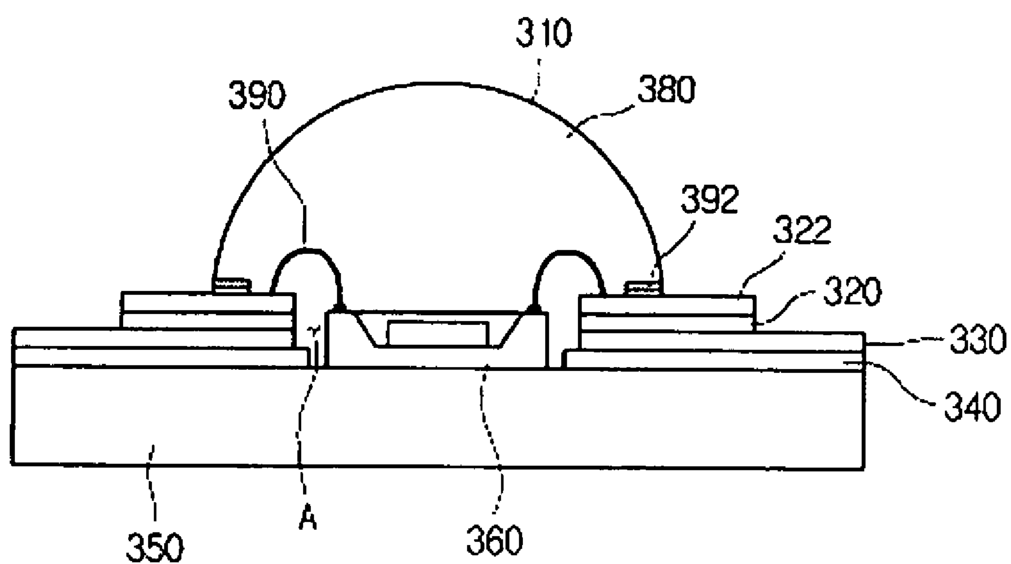
FIG. 3 is a cross sectional view of a light emitting device package according to a first embodiment of the present invention.

FIG. 3 is a cross sectional view of a light emitting device package according to a first embodiment of the present invention Referring to FIG. 3, the light emitting device package according to a first embodiment of the present invention comprises a lens portion 310, a silk screen layer 392, a light emitting device 360, an electrode layer 320, an electrical circuit layer 330, an insulating layer 340, and a metal base 350.

Firstly, the metal base 350 is the lowermost layer of a metal PCB, and functions to mount other components on its top layer and support them, and release heat generated from the light emitting device 360 toward the bottom surface. The metal base 350 can be combined to a heat sink further provided on its bottom surface. It is preferable that the heat sink and the metal base 350 each form a fastening hole and are combined to each other by screw type fastening.

Additionally, if a heat transfer material is applied or provided on the combining surface between the metal base 350 and the heat sink, the heat radiation effect can be further maximized.

The insulating layer 340 electrically insulates between the electrical circuit layer 330 and the metal base 350 so that currents flowing in the electrical circuit layer 330 cannot flow toward the metal base 350. This, however, becomes an obstruction for an efficient heat radiation because the insulating layer 340 performs the function of insulation while simultaneously serving as a heat resistor.

Therefore, in the first embodiment of the present invention, the insulating layer 340 is removed at least at the portion where the light emitting device 360 is placed. That is, since the electrode structure of the light emitting device 360 is formed upward, it only needs to be physically combined without help from the insulating layer 340.

In order for the surface where the light emitting device 360 is placed to be removed, the insulating layer 340 may be processed by milling or etching. And, the light emitting device 360 is combined by a bonding member, such as a heat conductive hardening agent, when it is mounted on the metal base 350.

The electrically circuit layer 330 is placed on the top of the insulating layer 340. In the light emitting device package according to the first embodiment of the present invention, since light emitting devices 360 built in respective modules may be provided in plural number, the electrical circuit layer 330 consists of a plurality of circuits for applying electricity to the light emitting devices 360. Like the insulating layer 340, the electrical circuit layer 330 is removed at the portions where the light emitting devices 360 are placed.

As described above, since the light emitting devices 360 are provided in plurality numbers on one metal base 350, it is advantageous to construct the electrical circuit layer 330 as a serially connected circuit on one module for the sake of circuit design or package application.

The electrode layer 320 for energizing the light emitting devices 360 is positioned at the tip end of the electrical circuit layer 330, from which the portions where the light emitting devices 360 are positioned are removed, and connected to a wire 390. Thus, in the first embodiment of the present invention, it can be known that the electrode layer 320 serves as a prior art lead frame. The wire 390 performs the function of electrically connecting the light emitting devices and the electrode layer.

Besides, the electrode layer 320 is generally made of metal, such as nickel, and a plating layer 322 is provided on the top surface thereof in order to improve the electric conductivity. Preferably, the plating layer 322 is formed of gold at a thickness of 0.3 mm or more through an electrolytic plating method. In such a structure, the electrical circuit layer 330 and the electrode layer 320 whose top surface is plated are preferably formed in a manner that the sum of the thickness of the two layers is within 200 mm.

The light emitting device 360 is provided with a light emitting portion made of a compound semiconductor and an electrode for applying current, and when a power is applied from the electrode layer 320, light emission is performed. As the light emitting device, a light emitting diode is preferably exemplified.

As made clear by the aforementioned structure, the light emitting device 360 can be directly mounted on the metal base 350 by being embedded in an opening space A of the insulating layer 340, electrical circuit layer 330 and electrode layer 320.

As the light emitting device 360, can be included a SiOB (Silicon Optical Bench) chip, a red LED chip, a green LED chip, a blue LED chip, a yellow LED chip, an orange LED chip, etc. Especially, the SiOB chip denotes a chip that is made by etching a cup-shaped space into a silicon substrate and mounting a LED in the space. The silicon substrate may be made of other material.

The electrode layer 320 has a silk screen layer 392 formed at an outer side of the portion to be bonded by the electrode of the light emitting device 360 and the wire 390. The lens portion 310 is attached to the silk screen layer 392. The lens portion 310 can be provided by a molding portion 380 where a transparent resin material is to be molded, and the molding portion 380 can be molded at a precise position by a procedure of attaching to the silk screen layer 392.

Figure 4:
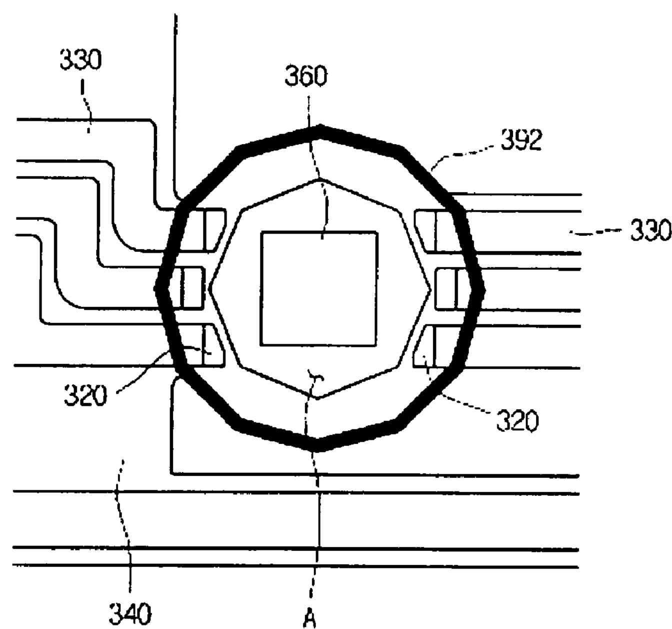
FIG. 4 is a plan view of the light emitting device package according to the first embodiment of the present invention.

FIG. 4 is a plan view of the light emitting device package according to the first embodiment of the present invention, especially, in which the shape of the silk screen layer is clearly illustrated. But, the wire is very small and thus not shown, and it is needless to say that a plurality of chips can be mounted simultaneously on the light emitting device 360.

Referring to FIG. 4, to protect the light emitting device 360 and the wire 390, the internal space of the molding space 380 constituting the lens portion 310 is molded from the upper surface of the metal base 350 at a height larger than that of the portion where the wire 390 is placed, especially, it is molded using a synthetic resin material such as epoxy or silicon. The molding portion 380 is a kind of high refractive filler material, and uniformly distributes the light diffused by the light emitting device 360.

As seen from above, the light emitting device package according to the first embodiment of the present invention has a merit that it is reduced in size, is freely arranged and can be built in respective modules with the improvement of heat radiation effect since a reflecting cup, a lead frame and a lens portion of the prior art light emitting device package are integrated and mounted on a metal PCB.

Second Embodiment

In explaining the second embodiment of the present invention, many parts of the foregoing description of the first embodiment of the present invention are incorporated. Hereinafter, only characteristically different portions will be described in detail.

Figure 5:
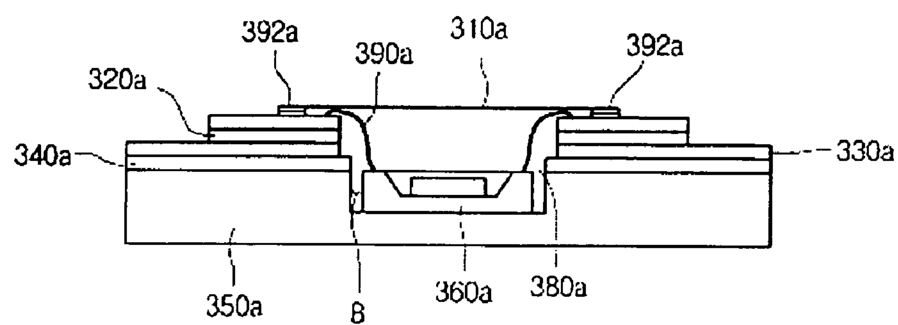
FIG. 5 is a cross sectional view showing an internal structure of a light emitting device package according to a second embodiment of the present invention.

FIG. 5 is a cross sectional view showing an internal structure of a light emitting device package according to a second embodiment of the present invention.

Referring to FIG. 5, the light emitting device package according to a second embodiment of the present invention comprises a lens portion **310*a*, a silk screen layer 392*a*, a light emitting device 360*a*, an electrode layer 320*a*, an electrical circuit layer 330*a*, an insulating layer 340*a*, a wire 390*a* and a metal base 350. The functions, structure and material of the lens portion 310*a*, silk screen layer 392*a*, light emitting device 360*a*, electrode layer 320*a*, electrical circuit layer 330*a* and insulating layer 340*a*** are similar to those of the first embodiment of the present invention.

The only difference from the first embodiment is that only parts of the metal base **350*a* are removed in the region where the light emitting device 360*a* is placed, and the light emitting device 360*a* is placed in a removal region B from which the metal base 350*a*** is removed.

More specifically, the removal region B can be processed by a given processing method such as milling or the like. As the light emitting device **360*a* is embedded in the removal region B, the top surface of the lens portion 310*a* establishes equilibrium, and the overall height of the lens portion can become smaller than in the first embodiment. Besides, the light emitting device 360*a*** is inserted into the removal region B, thus allowing the bottom surface to be attached by a thermal conductive hardening agent.

The light emitting device **360*a* mounted in the removal region B is energized by the electrode layer 320*a* and the wire 390*a* positioned relatively higher than the light emitting device 360. Like in the first embodiment of the present invention, a molding portion 380*a* is provided in order to protect the light emitting device 360*a* and the wire 390*a***.

At this time, the molding portion 380 is also relatively low in height, which is possible because the light emitting device **360*a* is inserted and placed in the metal base 350*a*, and the space for bonding the wire 390*a* is also placed at a relatively lower side. In the second embodiment of the present invention, it is preferable that the molding portion 380*a* is formed at such a height as to protect the light emitting device 360*a* and the bonding portion 390*a***.

By such a structure, the thickness of the lens portion 310 can be smaller, and furthermore the highest side of the lens portion **310*a*** can be planarized and reduced in height, thus enabling it to use various kinds of lenses including a Fresnel lens.

Moreover, a molding member of a synthetic resin material such as epoxy or silicon is directly injected into the recess of the metal base **350*a***, and thus there is no need to use a gap for injecting the molding member as in the prior art. By this, air bubbles can be prevented from generation upon molding.

As explained above, the position of the light emitting device 360*a*, the structure of the molding portion 380*a* and a decrease of the lens thickness allows red, green and blue to be mixed with each other on much smaller regions, thereby making a finally diffused light come close to a point source of light.

Moreover, the removal region B may be formed in a cylindrical recess, or the sides of the cylindrical recess B may be formed inclined at a predetermined angle. The inner surface of the recess B forming the predetermined angle can increase the reflection efficiency of light. Furthermore, it is preferable that the sides of the recess B are gloss coated or provided with a reflection material so as to improve the reflectivity. Namely, in a case where the light emitting device 360*a* light emits within the cylindrical recess B, the inclined surface of the metal base 350*a* reflects almost all of the light upward, and thus the light emission efficiency of the light emitting device 360 can be increased.

Third Embodiment

The third embodiment of the present invention is characterized in that it proposes an overall structure in which the light emitting package proposed in the first and second embodiments is used as a single unit.

Figure 6:
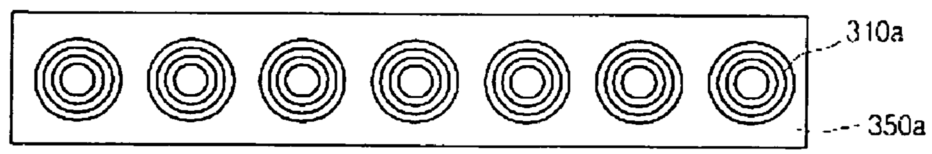
FIGS. 6, 7, 8 and 9 are views showing light emitting device packages arranged on a single metal base in a straight line, a round, a square and a hexagon.

Referring to FIG. 6, according to this embodiment, a plurality of light emitting device packages are provided on one metal base 350*a*, and lens portions 310*a* are respectively arranged on the light emitting device packages. Of course, it is possible to mount high output light emitting device packages in a smaller space by the electrical circuit layer 330*a* having a circuit for connecting the respective light emitting device packages. In the drawing, it is shown that the light emitting device packages are arranged in a straight line. That is, a plurality of light emitting device modules provided by the respective light emitting devices is arranged in a straight line.

In this case, in the first and second embodiments of the present invention, the metal PCB may have a reflection material on the surface of the layer open to the top surface out of the electrical circuit layers 330 and 330*a*, electrode layers 320 and 320*a*, insulating layers 340 and 340*a* and metal bases 350 and 350*a*, or may be gloss coated. By the reflection material or gloss-coating, the light emitted from the light emitting devices 360 and 360*a* provided in plural number have a high reflection efficiency even on the metal PCB outside the lens portions 310 and 310*a*.

Moreover, in the drawing, the portions indicated in round exemplify the shape of a Fresnel lens serving as the lens portion 310*a*, and the mounting surface is indicated in a simplified form by the metal base 350*a*.

Figure 7:
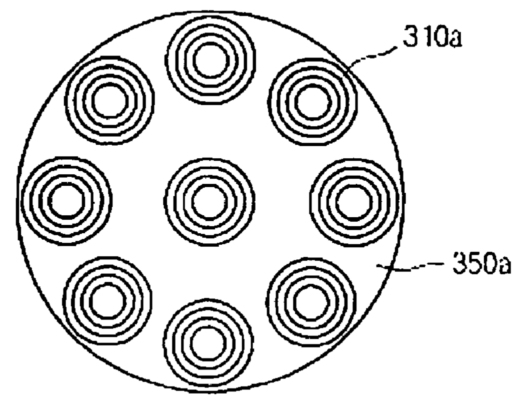
Figure 8:
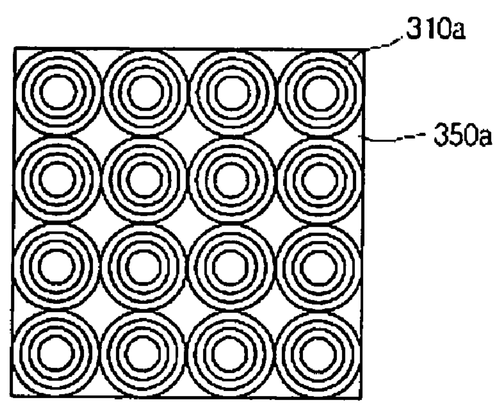
Figure 9:
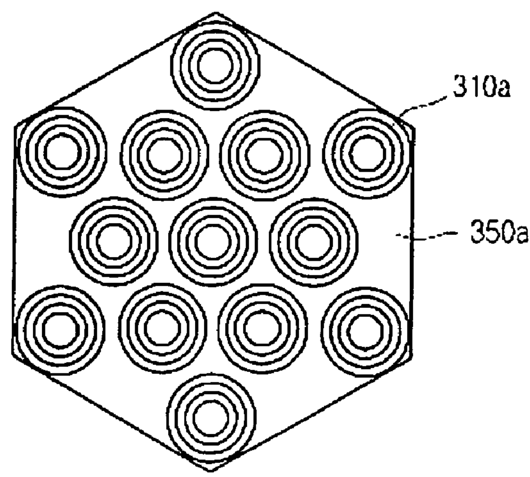

FIGS. 7, 8 and 9 show another embodiments in which light emitting device packages on a single metal base 350*a* can be arranged in a round shape, a square shape and a hexagonal shape, respectively. These arrangements of the light emitting device packages may change according to specific uses for applying light emitting devices.

Figure 10:
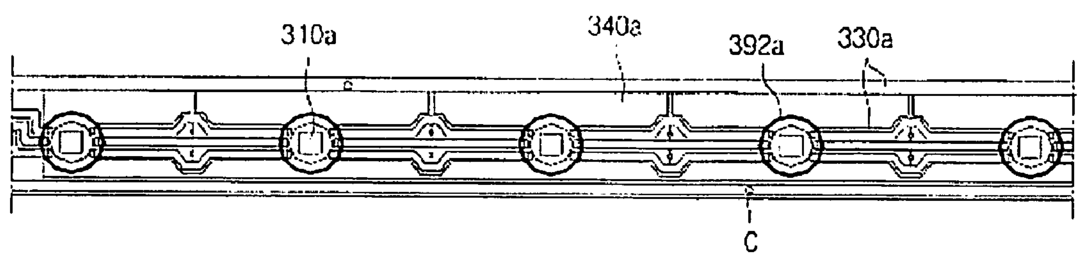
FIG. 10 is an enlarged view of the light emitting device packages according to the embodiments of the present invention arranged in a straight line.

FIG. 10 is an enlarged view of the light emitting device packages according to the embodiments of the present invention arranged in a straight line.

Referring to FIG. 10, in the electrical circuit layer 330*a*, it can be seen that the respective light emitting device packages indicated as the silk screen layer 392*a* on the insulating layer 340*a* are supplied with power so that the plurality of light emitting device packages may be energized simultaneously through a serial connection circuit. Of course, it is also possible to supply power to the respective light emitting devices of green, red and blue by providing a plurality of serial connection circuits.

Meanwhile, a fastening hole C of the metal base 350*a* is a hole for combining via a heat sink and a screw type fastening structure in a case where an additional heat sink is secondarily provided on the metal base 350*a* as explained in the first embodiment of the present invention.

MODE FOR INVENTION

The light emitting device package according to the present invention proposes a configuration for emitting a high output light, and is primarily focused on an arrangement structure of light emitting devices. To achieve the aforementioned objects, the present invention may be practiced in a variety of embodiments without departing from the foregoing embodiments, and such embodiments may be construed as within the spirit and scope of the present invention.

INDUSTRIAL APPLICABILITY

According to the light emitting package of the present invention, because heat generated from inside the light emitting device package can be efficiently released, as many high output light emitting devices as possible can be arranged in various forms in a restricted space, and thus, the light emitting device package can be utilized in various ways for products with a tendency to be decreased in size.

Additionally, according to the present invention, the manufacturing cost can be cut down, and the process can be minimized since light emitting device packages built in respective modules can be integrated and mounted through a structural improvement without having a radiator.

Besides, according to the present invention, it is possible to obtain a light emitting device package having excellent characteristics uniformly in terms of heat radiation, optics with high light collectivity, mechanics, product reliability, etc.

The invention claimed is:

1. A light emitting device package, comprising:

a base having an entire top surface that is flat;

a light emitting device on the flat top surface of the base;

an electrical circuit layer including a circuit with a predetermined pattern to electrically connect to the light emitting device, and including at least one end portion, a part of the at least one end portion being placed adjacent to the light emitting device;

an electrode layer disposed above a portion of the electrical circuit layer, and configured to electrically connect between the light emitting device and the electrical circuit layer;

a screen layer having an opening and disposed on the base adjacent to the light emitting device, the screen layer guiding a resin material to define a shape of a lens; and the lens formed with the resin material guided by the screen layer, and covering the light emitting device and the electrode layer, wherein the electrical circuit layer is disposed on the base so as not to protrude beyond edges of the base.

2. The light emitting device package of claim 1, wherein an entire bottom surface of the electrode layer is in contact with the electrical circuit layer.

3. The light emitting device package of claim 1, wherein the electrode layer is separated from the light emitting device and does not directly contact the light emitting device.

4. The light emitting device package of claim 1, wherein the lens is a molding which completely fills up any space between the light emitting device and the electrode layer.

5. The light emitting device package of claim 1, wherein the entire electrode layer is encapsulated by the lens.

6. The light emitting device package of claim 1, further comprising an insulating layer between the electrical circuit layer and the base.

7. The light emitting device package of claim 1, wherein a top surface of the electrode layer is plated.

8. The light emitting device package of claim 1, wherein the base is made of a metal.

9. The light emitting device package of claim 1, further comprising a heat sink disposed on a bottom surface of the base.

10. The light emitting device package of claim 1, wherein the base has a hole.

11. The light emitting device package of claim 10, wherein the hole is in contact with a heat sink disposed on a bottom surface of the base.

12. The light emitting device package of claim 1, further comprising a plating layer on the electrode layer.

13. A light emitting device comprising:

at least one light emitting package, each including:

a base having an entire top surface that is flat, a light emitting unit on the flat top surface of the base, an electrical circuit layer including a circuit with a predetermined pattern to electrically connect to the light emitting device, and including at least one end portion, a part of the at least one end portion being placed adjacent to the light emitting unit, an electrode layer disposed above a portion of the electrical circuit layer, and configured to electrically connect between the light emitting unit and the electrical circuit layer, a screen layer having an opening and disposed on the base adjacent to the light emitting unit, the screen layer guiding a resin material to define a shape of a lens, and the lens formed with the resin material guided by the screen layer, and covering the light emitting unit and the electrode layer, wherein the electrical circuit layer is disposed on the base so as not to protrude beyond edges of the base.

14. The light emitting device of claim 13, wherein the light emitting device includes more than one said light emitting package.

15. The light emitting device of claim 13, wherein an entire bottom surface of the electrode layer is in contact with the electrical circuit layer.

16. The light emitting device of claim 13, wherein the electrode layer is separated from the light emitting unit and does not directly contact the light emitting unit.

17. The light emitting device of claim 13, wherein the lens is a molding which completely fills up any space between the light emitting unit and the electrode layer.

18. The light emitting device of claim 13, wherein the entire electrode layer is encapsulated by the lens.

19. The light emitting device of claim 13, wherein each of the at least one light emitting package further comprises a heat sink disposed on a bottom surface of the base.

20. The light emitting device of claim 13, wherein the base has a hole.

21. The light emitting device of claim 20, wherein the hole is in contact with a heat sink disposed on a bottom surface of the base.

22. The light emitting device of claim 13, wherein each of the at least one light emitting package further comprises a plating layer on the electrode layer.

* * * * *